(12) United States Patent
Bondade et al.

(10) Patent No.: US 10,594,315 B2
(45) Date of Patent: Mar. 17, 2020

(54) SWITCHING RATE MONITORING AND CONTROL

(71) Applicant: TEXAS INSTRUMENTS INCORPORATED, Dallas, TX (US)

(72) Inventors: Rajdeep Bondade, Richardson, TX (US); Nathan Schemm, Rowlett, TX (US); Rajarshi Mukhopadhyay, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/651,897

(22) Filed: Jul. 17, 2017

(65) Prior Publication Data

US 2018/0219545 A1  Aug. 2, 2018

Related U.S. Application Data

(60) Provisional application No. 62/453,223, filed on Feb. 1, 2017.

(51) Int. Cl.
*H03K 17/16* (2006.01)
*H03K 5/1532* (2006.01)
*H03K 17/082* (2006.01)

(52) U.S. Cl.
CPC ......... *H03K 17/165* (2013.01); *H03K 5/1532* (2013.01); *H03K 17/0822* (2013.01); *H03K 17/168* (2013.01); *H03K 2217/0063* (2013.01); *H03K 2217/0072* (2013.01)

(58) Field of Classification Search
CPC .......................... H03K 17/165; H03K 17/166
See application file for complete search history.

(56) References Cited

U.S. PATENT DOCUMENTS

| | | | | |
|---|---|---|---|---|
| 4,857,931 A | * | 8/1989 | Gulczynski | H03M 1/162 341/122 |
| 6,429,638 B1 | * | 8/2002 | Wight | G01R 19/04 324/103 P |
| 6,972,611 B1 | * | 12/2005 | Thalheim | H03K 17/168 327/380 |
| 2001/0035743 A1 | * | 11/2001 | Feldtkeller | H02M 3/158 323/282 |
| 2008/0106297 A1 | * | 5/2008 | Jao | H03K 17/164 326/27 |
| 2009/0040796 A1 | * | 2/2009 | Lalithambika | H02M 3/33507 363/21.17 |

(Continued)

*Primary Examiner* — Thomas J. Hiltunen
(74) *Attorney, Agent, or Firm* — Michael A. Davis, Jr.; Charles A. Brill; Frank D. Cimino

(57) ABSTRACT

An apparatus to monitor and control a switching rate in a switch includes a differentiator circuit including a capacitor and a configurable resistor. The differentiator circuit further includes an input terminal of the capacitors configured to receive a first voltage from a switch and a differentiator node configured to receive a differentiated voltage based on the first voltage. The apparatus includes a peak detector circuit coupled to the differentiator node and configured to detect a peak value of the differentiated voltage. The apparatus further includes a driver circuit coupled to the peak detector circuit and configured to adjust a control signal to the switch responsive to the detected peak value of the differentiated voltage.

17 Claims, 4 Drawing Sheets

(56) References Cited

U.S. PATENT DOCUMENTS

| | | | | |
|---|---|---|---|---|
| 2010/0079186 A1* | 4/2010 | Zannoth | ............... | H03K 17/166 327/333 |
| 2011/0031949 A1* | 2/2011 | Zhang | ................. | H02M 3/1563 323/282 |
| 2013/0315294 A1* | 11/2013 | Ishizeki | ......... | H03K 19/018521 375/232 |
| 2015/0061750 A1* | 3/2015 | Kandah | ............. | H03K 17/0822 327/419 |
| 2016/0285366 A1* | 9/2016 | Lee | .................... | H05B 33/0815 |
| 2017/0012618 A1* | 1/2017 | Krishna | ............... | H03K 17/165 |
| 2017/0040894 A1* | 2/2017 | MeVay | ................ | H03K 5/1532 |

* cited by examiner

SWITCHING RATE MONITORING AND CONTROL

CROSS-REFERENCE TO RELATED APPLICATIONS

The present application claims priority to U.S. Provisional Patent Application No. 62/453,223, which was filed Feb. 1, 2017, is titled "Technique and Circuits to Achieve dV/dT Monitoring And Closed-Loop Control," and is hereby incorporated herein by reference in its entirety.

BACKGROUND

Circuits often contain voltage or current supplies that provide voltage or current to various components within the circuit. In some cases, circuits receive voltage or current from external supplies, and the externally-provided voltage or current is routed to components in the circuit. The circumstances in which a circuit permits the provision of voltage or current to a particular circuit component is often controlled using one or more switches. For example, a switch that is closed permits current flow through the switch and a switch that is open prevents current flow through the switch. Transistors, such as metal oxide semiconductor field effect transistors (MOSFETs), are a common type of circuit switch.

SUMMARY

According to an embodiment, an apparatus includes a differentiator circuit which further comprises a capacitor coupled to a resistor at a differentiator node. The capacitor is configured to receive a first voltage from a switch and the differentiator node is configured to receive a differentiated voltage based on the first voltage. The apparatus also includes a peak detector circuit coupled to the differentiator node. In some embodiments, the peak detector circuit is configured to detect a peak value of the differentiated voltage. The apparatus also includes a driver circuit coupled to the peak detector circuit and responsive to the detected peak value of the differentiated voltage, the peak detector is configured to adjust a control signal to the switch.

In another embodiment, an apparatus includes a differentiator circuit. The differentiator circuit further includes a capacitor coupled to a resistor at a differentiator node and the capacitor is configured to receive a first voltage from a switch. In some embodiments, the differentiator node is configured to receive a differentiated voltage. The apparatus also includes a peak detector circuit coupled to the differentiator node and configured to detect a peak value of the differentiated voltage to provide a detected peak value. The apparatus further includes a comparator configured to compare the detected peak value of the differentiated voltage with a reference voltage and to generate a comparator output signal based on the comparison. The apparatus includes a digital controller coupled to the comparator and configured to adjust a control signal to the switch based on the comparator output signal.

In yet another embodiment, a method includes, receiving, by a differentiator circuit, a voltage from a switch. The method also includes deriving a differentiated voltage from the voltage and detecting a peak value of the differentiated voltage. Responsive to the peak value of the differentiated voltage being greater than a first threshold voltage, the method further includes adjusting a control signal to the switch.

BRIEF DESCRIPTION OF THE DRAWINGS

For a detailed description of various examples, reference will now be made to the accompanying drawings in which.

DETAILED DESCRIPTION

The desired switching speed for transistors is largely application-dependent. For example, switching between a first state (e.g., logic high) and a second state (e.g., logic low) for a power transistor switch utilized in a high current or voltage load system, such as an industrial motor, may be relatively slow. Slow switching speeds, however, often result in switching losses. In other applications, such as battery chargers for electronic devices (e.g., smart phones), the switching speed is substantially faster but results in other undesirable effects. For example, in the case of a metal-oxide semiconductor field-effect transistor (MOSFET), voltage overshoot/undershoot and ringing may occur at the MOSFET drain terminal when the switching speed is fast. The high frequency and high amplitude voltage ringing produces electromagnetic interference which impacts system reliability and reduces the efficiency of the system.

Electromagnetic induction interference (EMI) noise and large switching losses are related to the switching rate, that is, the speed at which a switch (e.g., a transistor) transitions from one state (e.g., logic high) to another state (e.g., logic low). Transistors can be utilized in electronic applications (e.g., voltage regulators, charging circuits, smart phones, etc.) in which the transistors are repeatedly turned on and off. In the case of relatively fast switching speeds, unwanted energy is stored in the parasitic impedances present in the circuit. This unwanted energy should be subsequently dissipated; otherwise, it will lead to over-voltage stress, reduction in overall system lifetime, and EMI noise.

At least some of the embodiments disclosed herein are directed to a switching rate control sensor circuit configured to measure a peak value of a differentiated voltage which reflects the peak value of the rate at which the voltage across a transistor switch changes during switching. In response to the measured peak differentiated voltage, the switching rate control sensor circuit adjusts the magnitude of a control signal that drives the transistor switch. Because the magnitude of the control signal impacts switching speed, and further because switching speed impacts switching loss and EMI noise, adjusting the magnitude of the control signal mitigates the switching loss and EMI noise.

Figure 1:
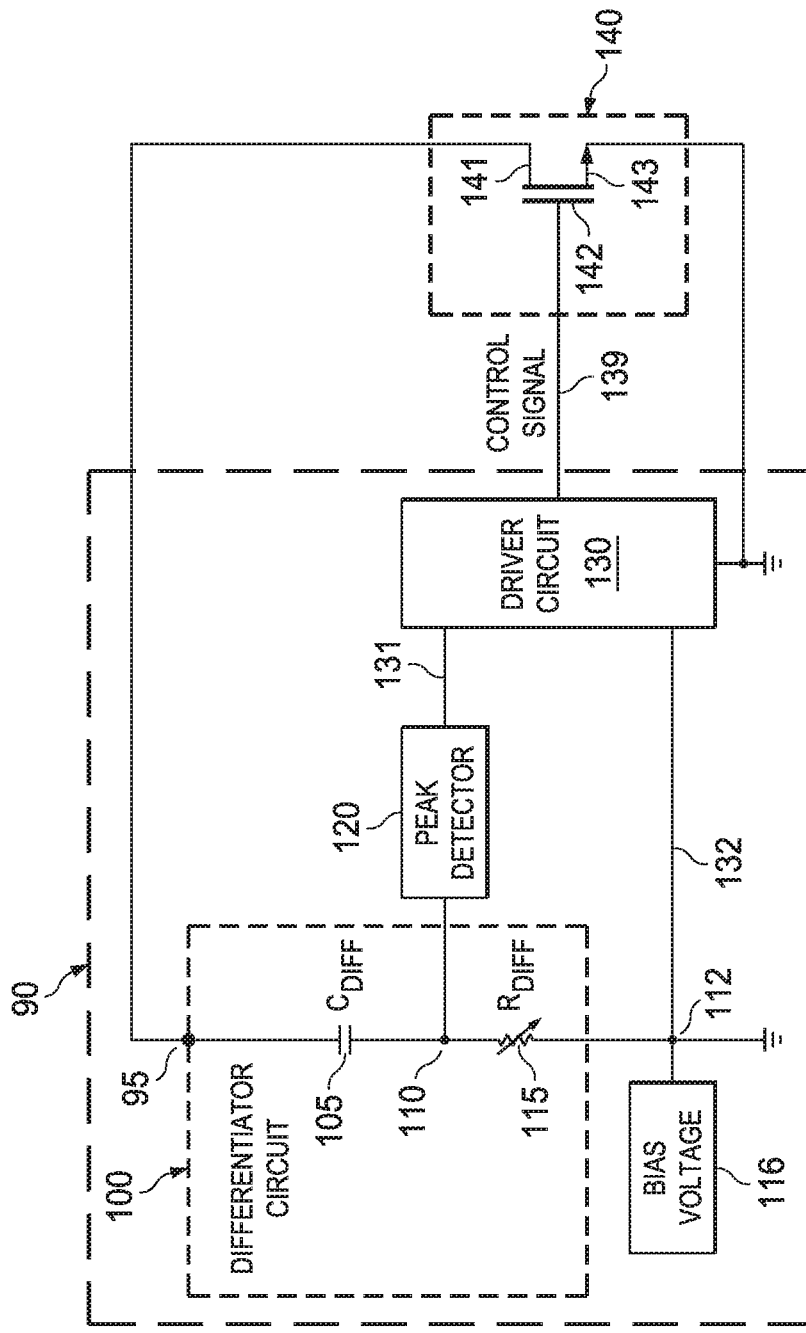
FIG. 1 depicts an illustrative switching rate control sensor circuit, in accordance with various examples.

FIG. 1 shows a switching rate control sensor circuit 90 configured to control the rate at which a switch 140 transitions from a first state to a second state. In some embodiments, the voltage across the switch 140 transitions from a higher voltage level (e.g., 1000 V) to a lower voltage (e.g., 0 V) when the switch 140 is turned on. EMI interference, system efficiency, and other performance metrics depend on the rate at which this drop from the higher voltage level to the lower voltage level occurs. This transition is not instantaneous and thus occurs with time, such that the slope of the curve relating voltage to time is negative because the switching occurs from a high voltage to a low voltage. Similarly, in some embodiments, the voltage across the switch 140 transitions from a lower voltage level to a higher voltage level when the switch 140 is turned off and, in this case, the slope of the voltage curve is positive. The aforementioned performance metrics depend on the rate at which this transition occurs.

In the example of FIG. 1, the switch 140 is a metal oxide semiconductor field effect transistor (MOSFET). The switch 140 comprises a drain 141, a source 143, and a gate 142. The gate 142 is a control input that controls the operation of the switch 140. In other embodiments, the switch 140 is a bipolar transistor, in which case the control input to control operation of the switch 140 can be a base. In other embodiments, the switch 140 comprises silicon carbide (SiC) transistors and in yet other examples, the switch 140 is a device that has properties similar to the properties of a transistor or any other semiconductor switching device.

In the embodiment of FIG. 1, the switching rate control sensor circuit 90 includes a differentiator circuit 100, a bias voltage source 116, a peak detector 120, and a driver circuit 130. The drain 141 of the switch 140 couples to the differentiator circuit 100 at the input terminal 95, and the source 143 couples to ground. In this implementation, the differentiator circuit 100 includes a differentiator capacitor (Cdiff) 105 connected to differentiator resistor (Rdiff) 115 in series. In some embodiments, the Cdiff 105 and/or the Rdiff 115 are programmable and the values of both Cdiff and Rdiff can be selected as desired. The differentiator circuit 100 generates a voltage at a differentiator node 110 directly proportional to the dV/dt transition of the input voltage received at the input terminal 95 from the switch 140 when the switch 140 transitions between states (e.g., high to low). More specifically, the differentiator circuit 100 generates the voltage (referred to as the differentiated voltage) of Rdiff*Cdiff*dV/dt at the differentiator node 110, where dV/dt is the rate at which the input voltage at the input terminal 95 changes. The input voltage at the input terminal 95 comprises, in this example, the drain voltage at the drain 141 of switch 140.

In some embodiments, the peak detector 120 of FIG. 1 includes one terminal coupled to the differentiator circuit 100 at the differentiator node 110. As described further below, the peak detector 120 outputs a DC voltage on connection 131 indicative of the peak value of the differentiated voltage detected at the differentiator node 110. The connection 131 couples the peak detector 120 to the driver circuit 130, which is configured to adjust a control signal 139 asserted to the gate 142 of the switch 140. Adjusting the control signal 139 causes the dV/dt of the switch 140 to change, i.e., the higher the control signal 139, the faster the switch 140 transitions between states and thus, in this implementation, the higher the absolute value of dV/dt. Similarly, the lower the control signal 139, the slower the switch transitions between the states, thereby resulting in a lower absolute value of dV/dt.

The peak detector 120 captures the extrema of the voltage at the differentiator node 110. In some embodiments, the peak detector 120 tracks or follows the input voltage, i.e., the differentiated voltage, until the extreme point (e.g., maximum point) is reached but holds the extreme point as the input decreases. The peak value of the differentiated voltage is received by the driver circuit 130 which is configured to compare the peak value of the differentiated voltage with a pre-set and/or configurable reference value to determine if the peak value is higher than (or "too high") or lower than (or "too low") the reference value. In response to the determination, the driver circuit 130 adjusts the control signal 139 in order to adjust the peak value of the differentiated voltage—or the absolute value of dV/dt—in the next cycle, i.e., when the switch 140 is turned on again. As noted above, the Cdiff 105 and/or the Rdiff 115 are programmable and the values of both Cdiff and Rdiff can be selected as desired. In some embodiments, the values of Cdiff and Rdiff depend on a target differentiated value.

Figure 2:
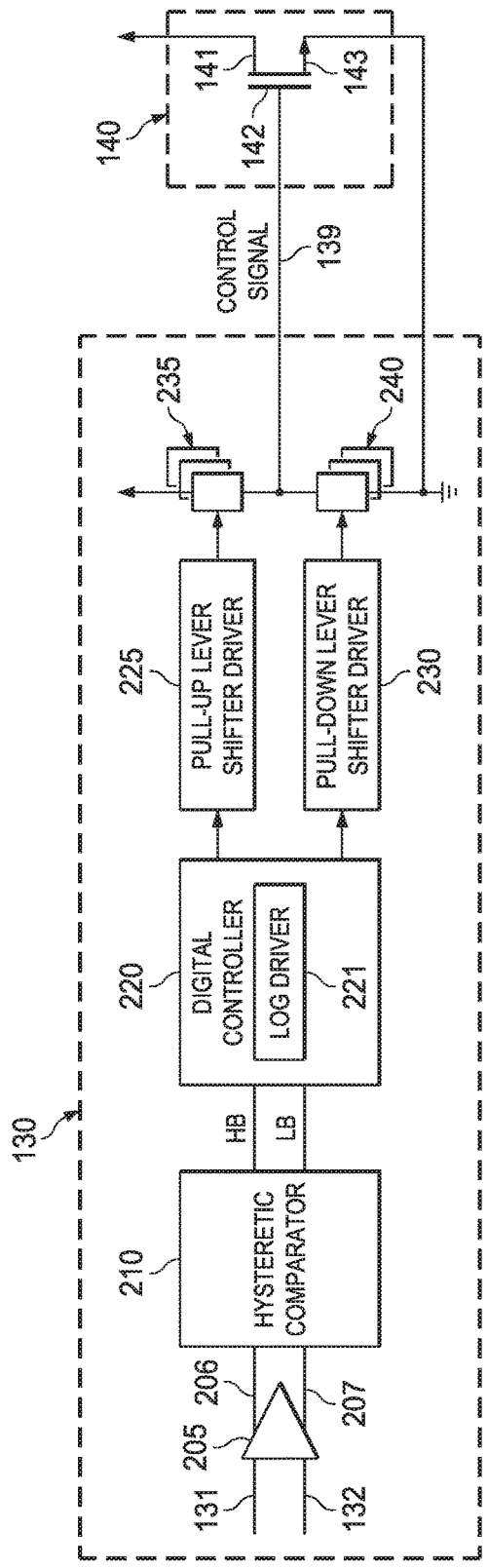
FIG. 2 shows a more detailed diagram of the illustrative switch driver of FIG. 1, in accordance with various examples.

FIG. 2 shows an example of the driver circuit 130 of FIG. 1. In this example, the driver circuit 130 includes an amplifier 205, a hysteretic comparator 210 coupled to the amplifier 205, and a digital controller 220 coupled to the hysteretic comparator 210. The driver circuit 130 further comprises a pull-up level shifter-driver 225 which drives segmented-high-side switches 235 and a pull-down level shifter-driver 230 which drives segmented-low-side switches 240. The pull-up level shifter-driver 225 and the pull-down level shifter-driver 230 are coupled to the digital controller 220.

In this example, the amplifier 205 receives the detected peak value of the differentiated voltage as captured by the peak detector 120. In some embodiments, the amplifier 205 can be a differential input-differential output sample-and-hold amplifier that amplifies the peak value of the differentiated voltage with reference to a base voltage. For example, the amplifier 205 receives two inputs via connections 131, 132 and provides two outputs through two connections 206, 207. In this embodiment, the amplifier 205 receives the peak value of the differentiated voltage captured by the peak detector 120 as the first input via the connection 131 and as the second input via the connection 132, the amplifier 205 receives a bias voltage from the bias voltage source 116 (FIG. 1) as a reference voltage via the bias node 112. In some embodiments, the amplifier 205 outputs a first amplifier output signal at connection 206 and a second amplifier output signal at connection 207, where the amplifier outputs are amplified forms of the inputs. The difference between signals on the connections 206 and 207 is proportional to the detected peak value of the differentiated voltage.

In some embodiments, the outputs of the amplifier 205 are provided to the hysteretic comparator 210. The hysteretic comparator 210 is configured to generate two output bits, herein referred to as HB bit and LB bit, to indicate whether the detected peak value of the differentiated voltage at the connection 131 is high or low, e.g., high or low with respect to the reference voltage at the connection 132. For different target differentiated voltages (i.e., voltages that are desired by a user employing the switching rate control sensor circuit 90), the reference voltage of the hysteretic comparator 210 can be adjusted, as further described below. In some embodiments, the target differentiated voltage can be achieved by keeping the reference voltage constant and adjusting either the Cdiff 105 and/or the Rdiff 115.

The peak value of the differentiated voltage can be detected when the transistor switch 140 is being turned on or turned off. While the switch 140 is being turned on, in response to output bits HB and LB, the digital controller 220 determines the adjustment to be made to the control signal 139. For example, if the hysteretic comparator 210 determines that the detected peak value of the differentiated voltage is high, the HB bit is set to 1 and the LB bit is set to 0. The digital controller 220 responds to this combination of HB and LB bits by adjusting the control signal 139 by varying the number of turned-on segmented-high-side switches 235 (via pull-up lever shifter driver 225) to be activated, i.e., turned-on, to turn on the switch 140. Digital controller 220 uses a PWM signal to detect if the switch 140 is to be turned on or off. For example, when the PWM signal goes from a low level to a high level, it acts a command for the switch to turn-on, and when the PWM signal goes from a high level to a low level, it acts a command for the switch to turn-off. However, if the hysteretic comparator 210 determines that the detected peak value of the differentiated voltage is lower than the voltage threshold, the HB bit is set to 0 and the LB bit is set to 1. In response, the digital controller 220 varies the number of turned-on segmented-high-side switches 235 to adjust the control signal 139 asserted to the switch 140.

Similarly, when the switch 140 is being turned off, in response to output bits HB and LB, the digital controller 220 determines the adjustment to be made to the control signal 139. For example, if the hysteretic comparator 210 determines that the detected peak value of the differentiated voltage is high, the HB bit is set to 1 and the LB bit is set to 0. The digital controller 220 responds to this combination of HB and LB bits by adjusting the control signal 139 by varying the number of turned-on segmented-low-side switches 240 to be activated (via pull-down lever shifter driver 230) to turn off the switch 140. However, if the hysteretic comparator 210 determines that the detected peak value of the differentiated voltage is lower than the voltage threshold, the HB bit is set to 0 and the LB bit is set to 1. In response, the digital controller 220 varies the number of turned-on segmented-low-side switches 240 to adjust the control signal 139.

For example, where the switch 140 is being turned on and the outputs of the hysteretic controller 210 indicate that the peak value of the differentiated voltage is high, the digital controller 220 adjusts (e.g., reduces) the magnitude of the control signal 139 received by the switch 140. In this example, the magnitude of the control signal 139 may be adjusted by reducing the number of high-side segmented switches 235 turned on to charge the gate terminal 142 of the switch 140. The higher the number of high-side segmented switches 235 that are turned on, the higher the magnitude of the current of the control signal 139 to the gate terminal 142 and the faster the switch 140 turns on. Conversely, reducing the number of high-side segmented switches 235 that are turned on results in the switch 140 turning on more slowly, i.e., the lower the rate at which the switch 140 turns on.

Similarly, in embodiments where the switch 140 is being turned off, the outputs of the hysteretic controller 210 can indicate that the peak value of the differentiated voltage is high. Consequently, the digital controller 220 adjusts (e.g., reduces) the magnitude of the control signal 139 received by the switch 140. In this example, the magnitude of the control signal 139 is adjusted by reducing the number of low-side segmented switches 240 turned on to discharge the gate terminal 142 of the switch 140. The higher the number of low-side segmented switches 240 that are turned on, the higher the discharging rate of the gate terminal 142 and the faster the switch 140 turns off. Conversely, reducing the number of low-side segmented switches 240 that are turned-on results in the switch 140 turning off more slowly, i.e., the lower the rate at which the switch 140 turns off.

In some embodiments, the adjustments made to the number of segmented switches used (i.e., high-side segmented switches 235 or low-side segmented switches 240 used) can produce a non-linear increase (e.g., with an uneven step size) in the control signal 139 over a wide range of possible control signals 139. As an example, assume that a wide dynamic range of the control signal 139, e.g., 20 mA to 10 A, can be applied to the switch 140. Increasing the control signal 139 by turning on an additional switch of the high-side segmented switched 235 produces a higher percentage change (or higher step size) in the control signal 139 when the control signal 139 is relatively small. For example, increasing the control signal 139 from 100 mA to 110 mA, with one additional switch of the high-side segmented switched 235 introducing 10 mA of additional current, results in an increase of 10% between two consecutive control signals. In contrast, increasing the control signal 139 by turning on an additional switch of the high-side segmented switched 235 produces a lower percentage change (or lower step size) in control signal 139 at a larger control signal 139. For example, increasing the control signal 139 from 5 A to 5.01 A with an additional switch of the high-side segmented switched 235 introducing the same 10 mA of additional current results in a 0.2% increase between two consecutive control signals 139. Therefore, an increase in control signal 139 at a lower dynamic range requires a lower number of additional switches to be turned on to produce the desired control signal, and, conversely, an increase in control signal 139 at a higher dynamic range requires a higher number of additional switches to be turned on to produce the desired control signal, thus introducing non-linearity.

In some embodiments, the challenge of non-linear changes is solved using a logarithmic driver 221 (or "log driver") present in the digital controller 220. The log driver 221 is configured to produce a constant change (e.g., constant step size) in the control signal 139 over a wide dynamic range. For example, using a log driver produces a constant percentage increase over the entire dynamic range. The use of the log driver also compensates for process, voltage, and temperature (PVT) changes more simply than would a traditional driver. In some cases the control signal is determined by a nominal value, multiplied by correction factors for PVT. However, conversion to a log implementation by utilizing a log driver changes the product to a sum, thus leading to a less complex hardware implementation.

Figure 3:
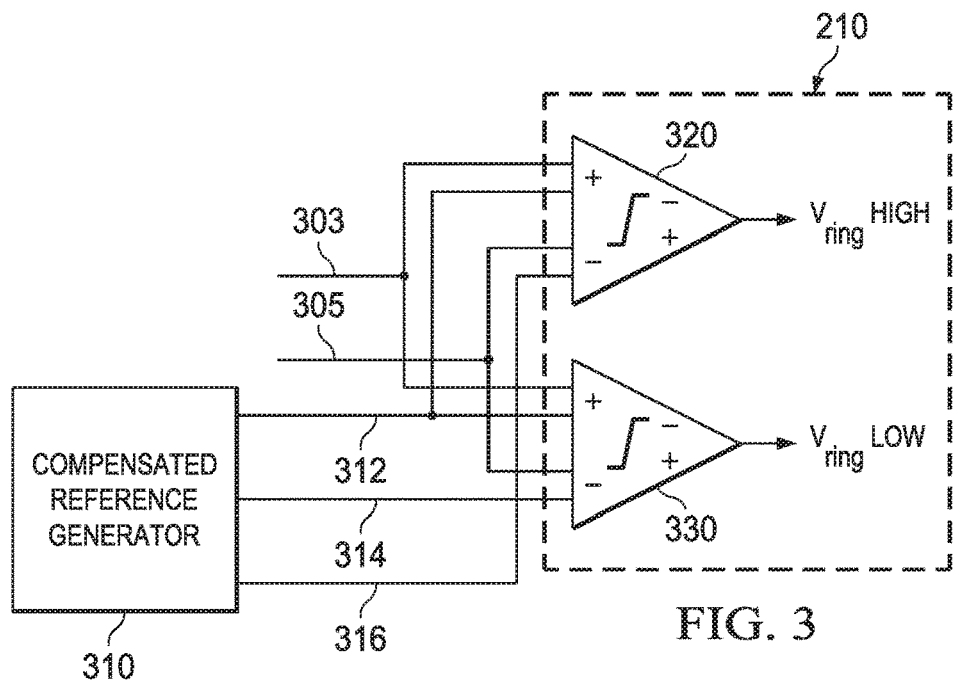
FIG. 3 shows a detailed diagram of the illustrative hysteretic comparator of FIG. 2, in accordance with various examples.

FIG. 3 shows a detailed diagram of the hysteretic comparator 210 in accordance with various embodiments. The hysteretic comparator 210 couples to a compensated reference generator 310, a high side comparator 320 generating the HB bit and a low side comparator 330 generating the LB bit. In some embodiments, the comparator reference values—generated by the compensated reference generator 310—are configured in accordance with the application in which the switching rate control sensor circuit 90 (FIG. 1) is being utilized. The compensated reference generator 310 is a stand-alone reference generator supplying reference values to both the high side comparator 320 and the low side comparator 330. In some embodiments, the compensated reference generator 310 is programmed by the user employing the switching rate control sensor circuit 90.

The high side comparator 320 generates the HB bit by comparing input voltages with comparator reference values. For example, the high side comparator 320 subtracts the first amplifier output signal received at 303 (received from 206) from a positive reference voltage 312 to form a first input and subtracts the second amplifier output signal received at 305 (received from 207) from a negative high side reference value 316 to form a second input. In some embodiments, the high side comparator 320 further compares the added value of the first input and the second input with a pre-set reference value (e.g., 1). The pre-set reference value is programmed into both the high side comparator 320 and the low side comparator 330, for example. If the added value is positive, i.e., above the reference value, the HB bit will be 1, indicating a "too high" peak differentiated voltage.

Similarly, the low side comparator 330 generates the LB bit by comparing input voltages with comparator reference values. For example, the low side comparator 330 subtracts a first amplifier output signal received at 303 (received from 206) from a positive reference voltage 312 and subtracts a second amplifier output signal 305 (received from 207) from a negative low side reference value 314 to produce a first and a second input, respectively. Further, the low side comparator adds the first and the second inputs and compares the added value with the pre-set reference value (e.g., 1). If the added value is negative, i.e., below the pre-set reference value, the LB bit will be 1, indicating a "too low" peak differentiated voltage. As noted above, the pre-set reference value can be programmed into the hysteretic comparator 210.

In some embodiments and as described in detail below with respect to FIG. 4, the switch 140 is hard-switched or soft switched. For example, the switch 140 is said to be hard-switched when the voltage at the drain 141 is higher than a first threshold voltage (e.g., 900 V) at the instant at which the switch 140 is indicated to be turned on. In contrast, the switch 140 is said to be soft-switched when the voltage at the drain 141 is lower than a second threshold voltage (e.g., 20 V) at the instant at which the switch 140 is indicated to be turned on. The switching rate control sensor circuit 90 (FIG. 1) is advantageously employed if the switch 140 is hard-switched, as during hard-switching, the voltage at the drain 141 is higher than the first threshold and will transition from a relatively high voltage level (e.g., 910 V) to a relatively low voltage level (e.g., 0 V). However, the switching rate control sensor circuit 90 can be avoided during soft switching as the voltage at the drain 141 is lower than the second threshold (e.g., 20 V) and employing a switching rate control sensor circuit 90 to control the transition from relatively low voltage (e.g., 20 V) to ground is unwarranted.

Figure 4:
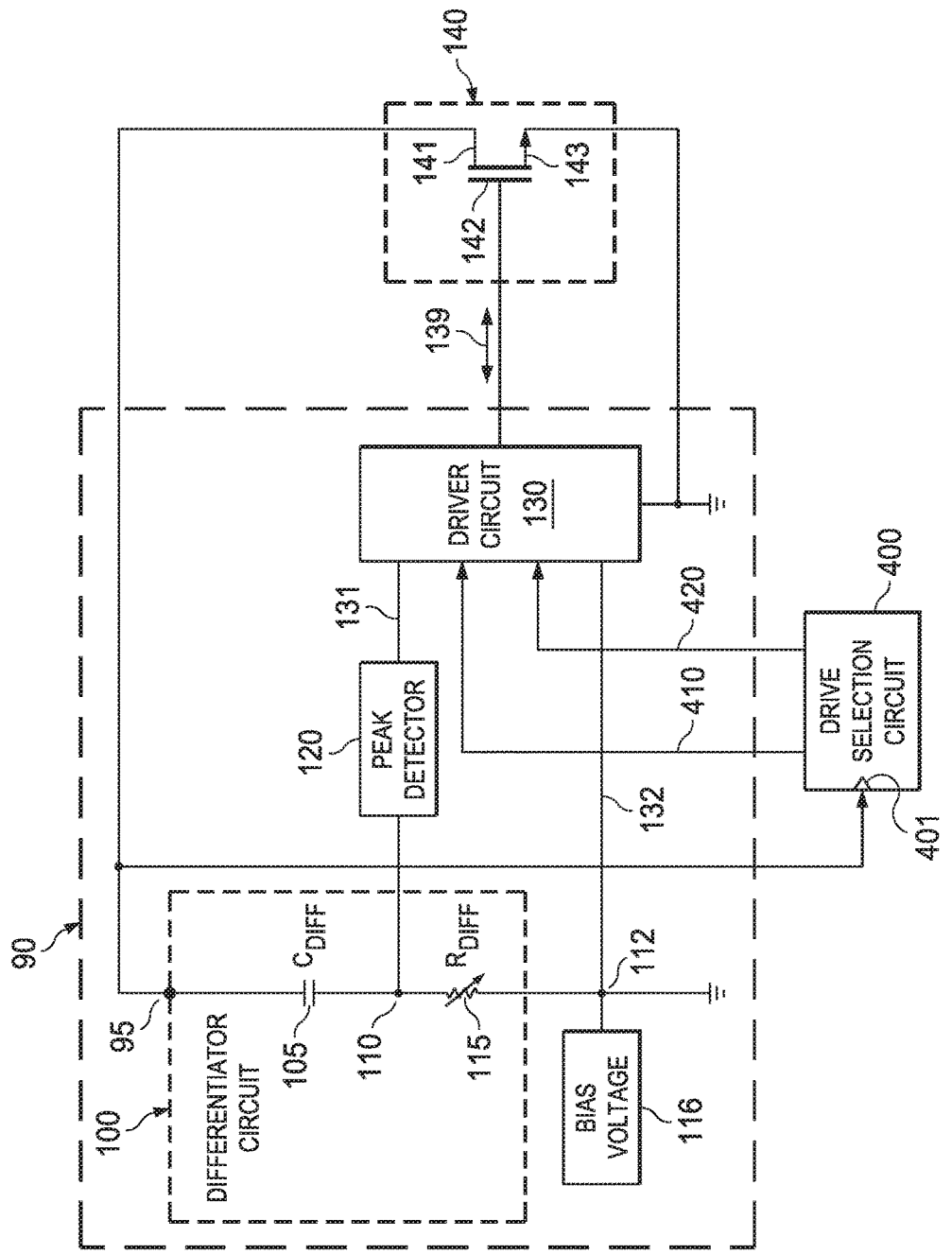
FIG. 4 shows a modified version of the illustrative switching rate control sensor circuit depicted in FIG. 1, in accordance with various examples.

FIG. 4 depicts an alternative embodiment of the switching rate control sensor circuit 90. FIG. 4 includes a drive selection circuit 400 to generate a first output 410 and a second output 420. Both the outputs 410 and 420 are received by the driver circuit 130. In this example, the drive selection circuit 400 receives the drain voltage of the switch 140 as an input at the input terminal 401. The drive selection circuit 400 can be employed to detect the "type" of switching that occurs at the switch 140. The example embodiments disclosed herein assume that switching (hard or soft) occurs when the switch 140 is turned on and results in the drain voltage of the switch 140 transitioning from a relatively high voltage level to a relatively low voltage level.

Figure 5:
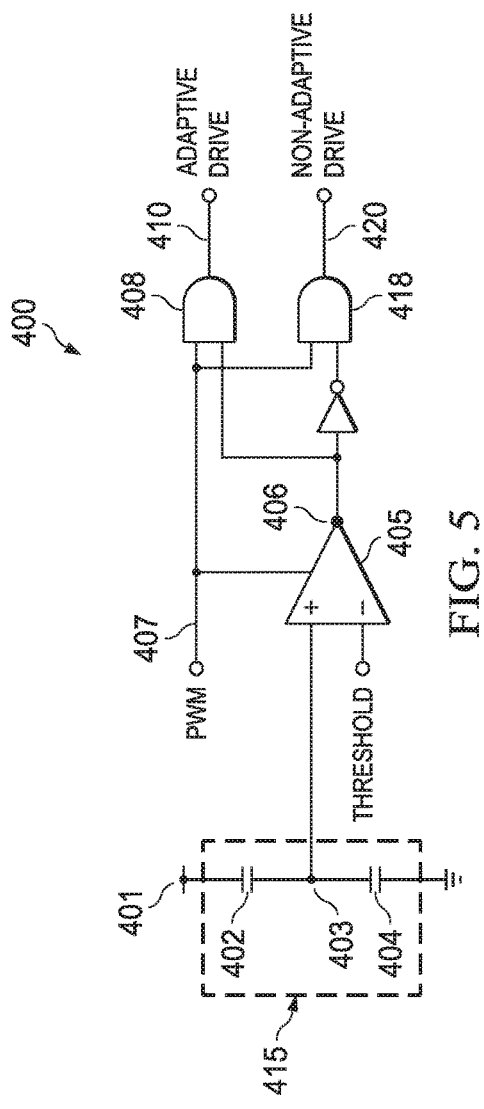
FIG. 5 shows an illustrative drive selection circuit, in accordance with various examples.

FIG. 5 depicts the driver selection circuit 400 in detail. The drive selection circuit 400 receives input at the input terminal 401 which is connected to a voltage divider circuit 415 including a first capacitor 402 coupled in series with a second capacitor 404 at a node 403. In this embodiment, the input voltage received at the input terminal 401 is the drain voltage of the switch 140. The voltage divider circuit 415 divides down the input voltage received at the input terminal 401 to a lower voltage level at node 403, which is provided to the comparator 405. The comparator 405 also receives a threshold voltage from any suitable source (e.g., from another circuit).

In some cases, a PWM, or a pulse-width modulation signal, is a signal used by the drive selection circuit 400. The PWM signal is generated by an external controller requesting a driver to turn on/off a switch. Depending on the type of system, the generation of the PWM signal may vary. For a power regulation system, such as DC-DC converter for example, the PWM signal is generated by a separate feedback controller IC that regulates the output DC voltage and the feedback controller determines the width of the pulse (which defines the state of the PWM signal), and the frequency. FIG. 5 shows the drive selection circuit 400 receiving a PWM signal—supplied by an external controller—in order to determine if an ADAPTIVE DRIVE CONTROL or NON-ADAPTIVE DRIVE control is required at turn-on. In some embodiments, the threshold voltage defines the threshold level for the type of switching (hard or soft). In some embodiments, the comparator 405 is a track and latch comparator. For example, the comparator 405 can receive a PWM signal 407 indicating when the switch 140 is to be turned on or off. The PWM signal 407 acts as an enabler signal that enables the comparator 405 at an edge of the PWM signal 407, e.g., when the PWM signal 407 is going from a logic high (1) to a logic low (0) to turn off the switch 140, or from a logic low to a logic high to turn on the switch 140. When the PWM signal 407 is 0, the switch 140 is signaled to be switched off and when the PWM signal 407 is 1, the switch 140 is signaled to be turned on.

The comparator 405 of the drive selection circuit 400 compares the voltage at node 403 to the threshold voltage and checks the status of the PWM signal 407. The PWM signal 407 transitions from 0 to 1, and if, during this transition, the voltage at node 403 is higher than the threshold voltage, the logic AND gate 408 generates an output 1 as the first output 410 indicating an ADAPTIVE DRIVE control. However, if, during the PWM transition from 0 to 1, the comparator output at 406 is 0, it indicates that the voltage at node 403 is lower than the threshold voltage and the logic AND gate 418 generates an output 1 as the second output 420 indicating a NON-ADAPTIVE DRIVE control to be employed. When one of the outputs 410, 420 is high (i.e., 1), the other output is low (i.e., 0).

Referring again to FIG. 4, the outputs 410 and 420 of the drive selection circuit 400 indicating ADAPTIVE DRIVE and NON-ADAPTIVE DRIVE are received by the driver circuit 130. In some embodiments, the ADAPTIVE DRIVE and NON-ADAPTIVE DRIVE outputs are received by the digital controller 220 (FIG. 2) within the driver circuit 130. If the output of the drive selection circuit 400 generates an ADAPTIVE DRIVE output, no changes are made to the switching rate control sensor circuit 90, i.e., when the first output 410 is 1, the digital controller 220 continues to receive the HB bit and the LB bit from the hysteretic comparator 210. However, when the second output 420 of the drive selection circuit 400 generates a NON-ADAPTIVE DRIVE output, i.e., is 1, the drive selection circuit 400 bypasses the digital controller 220 of the driver circuit 130 (e.g., using a logic switch that can be incorporated into the driver circuit 130), turns off the terminals receiving the HB bit and the LB bit from the hysteretic comparator 210, and maintains the number of turned-on high-side segmented switches 235 and low-side segmented switches 240 to a fixed, predefined number.

Figure 6:
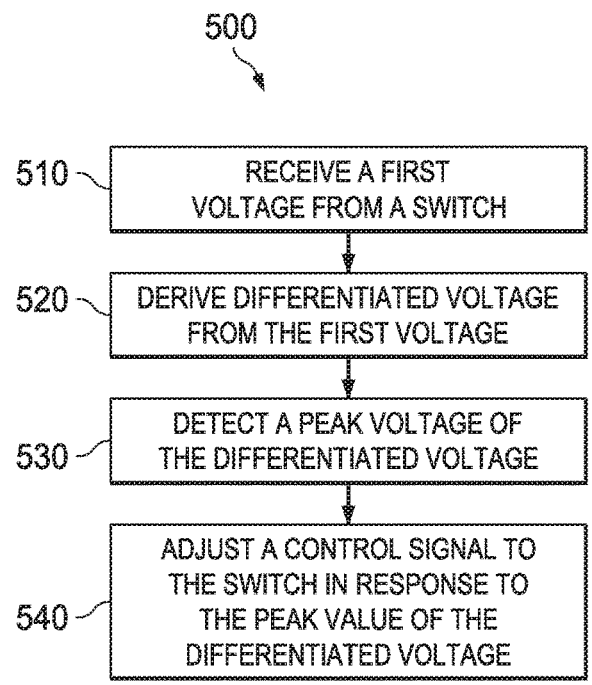
FIG. 6 depicts an illustrative method to adjust a control signal to a switch, in accordance with various examples.

FIG. 6 shows a method 500 used by the switching rate control sensor circuit 90 (FIG. 1) to adjust the control signal 139 asserted to the switch 140 (FIG. 2). The method 500 starts with the differentiator circuit 100 (FIG. 1) receiving the drain voltage of the switch 140 as an input at the input terminal 95 (step 510). For example, when the switch 140 is turned on, the voltage across the switch 140 transitions from a first voltage to a second voltage. According to the example embodiment discussed with respect to FIG. 1, the voltage drops from a relatively high voltage to a relatively low voltage. In other embodiments, the voltage across the switch 140 may increase from a low voltage to a high voltage. As discussed above, the transition from one voltage level to another voltage level is not ideal and therefore leads to a change in voltage level over time, referred to as dV/dt. The method 500 further continues with deriving a differentiated voltage at the differentiator node 110 (FIG. 1; step 520). For example, as discussed above, the differentiator circuit 100 generates a potential drop of Rdiff*Cdiff*dV/dt at the differentiator node 110 and the drop at the node 110 is thus proportional to dV/dt.

The method 500 further continues in step 530 with detecting a peak value of the differentiated voltage and in step 540 with the driver circuit 130 adjusting a control signal 139 to the switch 140 in response to the peak value of the differentiated voltage. For example, after receiving the detected peak value of the differentiated voltage, the driver circuit 130 amplifies and compares the peak differentiated voltage to a reference voltage level and further determines if the detected peak value of the differentiated voltage is high, i.e., HB=1 and LB=0, or low, i.e., HB=0 and LB=1. The digital controller 220 adjusts the control signal 139 by adjusting the number of segmented-high-side switches 235 while turning on the switch 140. Similarly, the number of segmented-low-side switches 240 can be adjusted (e.g., reduced) while turning off the switch 140. The method 500 may be modified as desired, including by adding, deleting, modifying or rearranging one or more steps.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. Apparatus comprising:
    a differentiator circuit including a reference input, a resistor, and a capacitor, the capacitor having first and second terminals, the reference input coupled through the resistor to the first terminal, and the second terminal adapted to be coupled to an output terminal of a switch;
    a peak detector circuit having a detector input and a detector output, the detector input coupled to the first terminal; and
    a driver circuit having a driver output adapted to be coupled to a control terminal of the switch, the driver circuit including:
        an amplifier having an amplifier input and first and second amplifier outputs, the amplifier input coupled to the detector output; and
        a comparator having first and second comparator inputs and first and second comparator outputs, the first and second comparator inputs respectively coupled to the first and second amplifier outputs, in which the first comparator output indicates whether a voltage at the first terminal has a higher-than-threshold rate of change with respect to time, and the second comparator output indicates whether the voltage at the first terminal has a lower-than-threshold rate of change with respect to time.

2. The apparatus of claim 1, wherein the driver circuit has a selection input, and the apparatus further comprises a drive selection circuit haivng a selection output coupled to the selection input, the drive selection circuit configured to generate a selection signal at the selection output; the driver circuit configured to: responsive to the selection signal being greater than a first threshold voltage, assert a fixed control signal at the driver output; and, responsive to the selection signal being less than a second threshold voltage, adjust the control signal at the driver output.

3. The apparatus of claim 1, wherein a resistance of the resistor is configurable according to a reference voltage and a target output voltage.

4. The apparatus of claim 1, wherein the driver circuit includes:
    segmented-high-side switches;
    segmented-low-side switches; and
    a digital controller, coupled to the comparator, the digital controller configured to adjust a current flowing through the segmented-high-side switches and the segmented-low-side switches responsive to the first and second comparator outputs.

5. The apparatus of claim 4, wherein the digital controller is configured to adjust, responsive to the first comparator output, a current flowing in the segmented-high-side switches by adjusting a number of the segmented-high-side switches used while turning on the switch.

6. The apparatus of claim 4, wherein the digital controller is configured to adjust, responsive to the second comparator output, a current flowing in the segmented-low-side switches by adjusting a number of the segmented-low-side switches used while turning off the switch.

7. The apparatus of claim 4, wherein the digital controller is configured to iteratively adjust a number of the segmented-high-side switches used while turning on the switch to achieve a linear relationship between the number of the segmented-high-side switches used and a current through the driver output.

8. The apparatus of claim 4, wherein the digital controller is configured to iteratively adjust a number of the segmented-low-side switches used while turning off the switch to achieve a linear relationship between the number of the segmented-low-side switches used and a current through the driver output.

9. Apparatus comprising:
    a differentiator circuit including a reference input, a resistor, and capacitor, the capacitor having first and second terminals, the references input coupled through the resistor to the first terminal, and the second terminal adapted to be coupled to an output terminal of a switch;
    a peak detector circuit having a detector input and a detector output, the detector input coupled to the first terminal;
    an amplifier having an amplifier input and first and second amplifier outputs, the amplifier input coupled to the detector output;
    a comparator having a comparator output and first and second comparator inputs, the first and second comparator inputs respectively coupled to the first and second amplifier outputs, in which the comparator output is responsive to a comparison by the comparator of: the first comparator input to a positive reference value; the second comparator input to a negative high side reference value; and the second comparator input to a negative low side reference value; and
    a digital controller haivng a controller input and a controller output, the controller input coupled to the comparator output, the controller output adapted to be coupled to a control terminal of the switch, and the digital controller configured to adjust the controller output responsive to the controller input.

10. The apparatus of claim 9, further comprising segmented-high-side switches, the digital controller configured to iteratively adjust a number of the segmented-high-side switches used while turning on the switch according to a constant step size change of current through the controller output per iteration.

11. The apparatus of claim 9, further comprising segmented-low-side switches, the digital controller configured to iteratively adjust a number of the segmented-low-side switches used while turning off the switch according to a constant step size change of current through the controller output per iteration.

12. The apparatus of claim 9, wherein the digital controller has a selection input, and the apparatus further comprises a drive selection circuit having a selection ouput coupled to the selection input, the drive selection circuit configured to generate a selection signal at the selection output; the digital controller configured to: responsive to the selection signal being greater than a first threshold voltage, assert a fixed control signal at the controller output; and, responsive to the selection signal being less than a second threshold voltage, adjust the control signal at the controller output.

13. A method, comprising:
receiving, by a differentiator circuit, a voltage from a switch;
deriving a differentiated voltage from the voltage;
detecting a peak value of the differentiated voltage;
responsive to the peak value of the differentiated voltage being greater than a first threshold voltage, adjusting a control signal to the switch;
amplifying the detected peak voltage to generate a first amplifier output signal and a second amplifier output signal; and
comparing the first amplifier output signal and the second amplifier output signal to a reference voltage, and generating a high side comparator output signal and a low side comparator output signal responsive to the comparison.

14. The method of claim 13, further comprising setting the control signal at a fixed current level responsive to the voltage being lower than a second threshold voltage.

15. The method of claim 14, further comprising setting a configuration parameter indicative of the fixed current level.

16. The method of claim 13, further comprising selecting, responsive to the high side comparator output signal, a number of segmented-high-side switches to be used while turning on the switch.

17. The method of claim 13, further comprising selecting, responsive to the low side comparator output signal, a number of segmented-low-side switches to be used while turning off the switch.

* * * * *